United States Patent [19]
Glaab

[11] Patent Number: 4,902,989
[45] Date of Patent: Feb. 20, 1990

[54] LOCAL AREA NETWORK COAXIAL CABLE CONNECTION DEVICE

[75] Inventor: Friedrich Glaab, Höchst, Fed. Rep. of Germany

[73] Assignee: BTS Broadcast Television Systems GmbH, Darmstadt, Fed. Rep. of Germany

[21] Appl. No.: 333,757

[22] Filed: Apr. 3, 1989

Related U.S. Application Data

[63] Continuation of Ser. No. 186,168, Apr. 26, 1988, abandoned.

[30] Foreign Application Priority Data

May 9, 1987 [DE] Fed. Rep. of Germany ....... 3715594

[51] Int. Cl.⁴ .............................................. H03H 7/48
[52] U.S. Cl. ..................................... 333/100; 333/136; 333/204; 375/7
[58] Field of Search ............... 333/100, 112, 115, 118, 333/121, 123, 124, 127, 136, 24 R, 128, 131; 375/3, 7, 36; 455/6, 7, 14, 73

[56] References Cited

U.S. PATENT DOCUMENTS

| | | | |
|---|---|---|---|
| 2,914,737 | 11/1959 | Tongue | 333/124 |
| 3,305,800 | 2/1967 | Velsink | 333/131 X |
| 3,440,571 | 4/1969 | Simons | 333/24 RX |
| 4,270,214 | 5/1981 | Davis et al. | 333/136 X |
| 4,419,636 | 12/1983 | Yu | 333/100 X |
| 4,803,485 | 2/1989 | Rypinski | 375/36 X |
| 4,803,699 | 2/1989 | Graham | 375/36 |

OTHER PUBLICATIONS

Ansi/IEEE Standard 802.3-1985, Carrier Sense Multiple Access With Collision Detection, pp. 13-14, 24-31.

*Primary Examiner*—Paul Gensler
*Attorney, Agent, or Firm*—Frishauf, Holtz, Goodman & Woodward

[57] ABSTRACT

The possible length of tap lines to the serial bus of a local area network is extended to about 0.7 meter by inserting an inductance 2 into the serial bus 1, and connecting a further coaxial cable 7 to a central tap 3 of the inductance. Preferably, the inductance 2 is a printed-circuit pass-through filter. The longer tap lines are particularly useful for connection of rack-mounted digital equipment in broadcasting studios, where it is inconvenient to place the equipment directly adjacent to a typically floor-level network cable.

13 Claims, 1 Drawing Sheet

U.S. Patent     Feb. 20, 1990     4,902,989

LOCAL AREA NETWORK COAXIAL CABLE CONNECTION DEVICE

This application is a continuation of application Ser. No. 07/186,168, filed Apr. 26, 1988, now abandoned.

Cross-reference to related patent application, assigned to the assignee of the present invention: U.S. Ser. No. 188,420, filed Apr. 29, 1988, GLAAB et al., claiming priority of Fed. Rep. Germany application No. P 37 15 595.4 of May 9, 1987.

The present invention relates generally to connectors for local area networks used in data communication, and more particularly to a center-tapped inductance arrangement which permits longer tap lines to stations on the network.

BACKGROUND

In the case of coaxial cables used as serial buses in a local area network (LAN), reliable transmission of signals depends upon maintaining predetermined specifications. For example, in the local area network known as CHEAPERNET, it is necessary that the capacitive loading, due to connection of a station (transceiver) to the network, not exceed 8 pF (picoFarads, i.e. $10^{-12}$ farads). Both the output stage of the transmitter and the input stage of the receiver are high-resistance, and therefore have a correspondingly small capacitance. In conventional arrangements, the transmitter/receiver or transceiver is connected to the cable by means of a "T-piece" coaxial connector. Preferably, so-called "BNC plugs" are used. Due to the requirement for low capacitance, in these conventional arrangements it is necessary to locate the input- and output-stages of these transmit/receive devices in the immediate vicinity of the coaxial connector or coaxial cable.

Broadcasting studio devices and installations comprise generally circuit boards, assembled to modules, which in turn are arranged in racks. The circuit boards are provided on their backsides with multi-pin or multiple plug connectors, which often are not directly connected to the cabling off the racks, but rather to connection devices. These connection devices serve to interconnect the circuit boards forming a module, and to connect a transceiver device disposed on the circuit board with a coaxial cable installed at the backside of the connection device.

THE INVENTION

It is an object of the present invention to permit placing a transceiver away from the coaxial cable serial bus of the network.

Briefly, this is made possible by inserting into the cable an inductance having a center tap, and running a further coaxial cable from the central tap to the transceiver. Preferably, the length of the further coaxial cable is such that the cable's capacitance is no more than 8 pF greater than the capacitance which, together with the inductance, defines the characteristic impedance of the serial bus. The arrangement has the advantage that the input- and output-stages of the transmit/receive apparatus need not be disposed in the immediate vicinity of the cable which serves as the serial bus, but rather can be spaced by up to about 0.7 meters away. In particular, this permits the use of a local area network with a serial bus within devices and installations, in which individual modules are equipped with connection devices. Specifically, in broadcasting studio equipment, for example video magnetic recording installations and film scanners and samplers, the technology of local area networks can be applied particularly well, using proven installation procedures. Independently of whether connection devices are used, the present invention makes possible a greater flexibility of spatial arrangement of the transmit/receive devices of installations.

The additional features of using a pass-through filter as the inductance, and of forming the filter as a printed circuit have the advantages of compactness and durability.

By appropriate selection of a further coaxial cable, and of the pass-through filter, the further coaxial cable can have a length of up to about 0.7 meters without degrading the data transmission in the local area network.

DRAWINGS

The following drawings, show an illustrative embodiment of the invention, in which.

DETAILED DESCRIPTION

Figure 1:
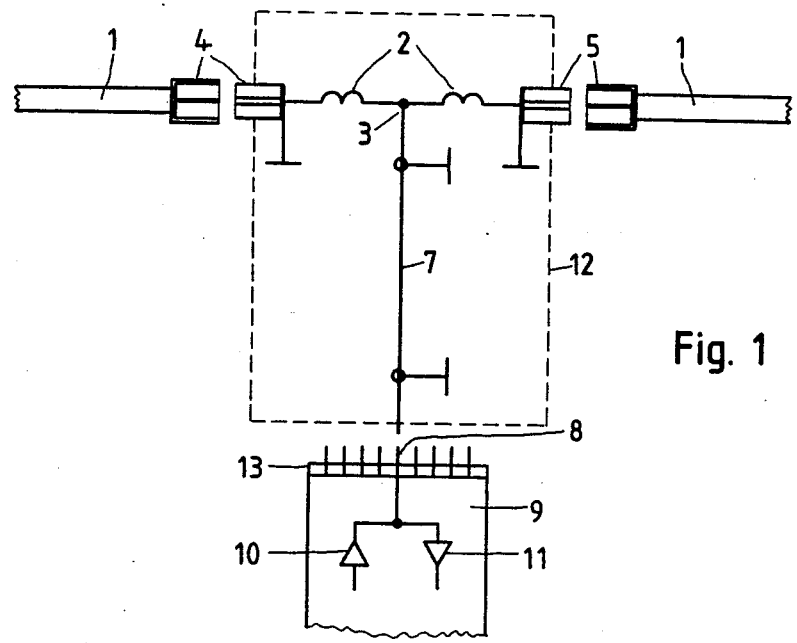
FIG. 1 is a schematic diagram of the circuit of the present invention.

The present invention relates generally to Local Area Network (LAN) specification 802.3 promulgated by the Institute of Electrical and Electronic Engineers (IEEE). The general structure and function of such networks, including ETHERNET and the aforementioned CHEAPERNET, is fully described in publicly available literature, so detailed description here would be superfluous. Given that background, several features of the preferred embodiment of the present invention will now be summarized:

FIG. 1 shows a cable 1, which serves as a serial bus and connects together various circuits, each having output stages of a transmitter and input stages of a receiver, connected to the cable. Data are transmitted at a data rate of 10 Megabits per second. The data to be carried are arranged in data packets, each of which begins with a preamble, followed by a destination address and a source address. Thereafter follows information about the length of the following data field, which in turn is followed by a few bytes for error recognition purposes. Prior to transmission of such a data packet, the originating station checks whether another station is already transmitting. This is accomplished by the Carrier Sense (CS) method. Despite this check, a "collision" can occur if two station start to transmit almost simultaneously, e.g. within a "time window" defined by the coursing or transmission time along cable 1 between the stations. In case of a Collision Detection (CD), the packet is repeated, after a randomly generated delay time.

This system imposes upon cable 1, and upon the connectors of the stations, stringent requirements as to their electrical values. Consequently, in conventional systems, the stations are connected directly to cable 1 with the shortest possible connectors, which is often incompatible with the structure of complex installations.

In accordance with a feature of the invention, an inductance 2 with a central tap 3 is interposed in the course of the cable. The two cable ends are connected via respective coaxial plug connectors 4, 5 to inductance 2. Central tap 3 of inductance 2 is connected via a further coaxial cable 7 with the terminal 8 of a transceiver 9, of which merely an output stage 10 and an input stage 11 are shown. The further coaxial cable 7 runs within a connection device 12, shown in dashed lines, and is connected to transceiver 9 via a contact pair of a multiple plug connector 13.

Inductance 2 preferably has a value of about 75 nano-Henrys (nH), which, given a capacitance of 30 picofarads (pF) between central tap 3 and ground potential, results in an oscillatory resistance or characteristic impedance of 50 ohms. Including the aforementioned permitted 8 pF capacitance, the coaxial cable 7 serving as a tap line can have a total capacitance of 38 pF. Thus, using an ordinary coaxial cable with a characteristic impedance of 75 ohms and a capacitance of 56 picoFarads per meter (pF/m), the maximum length of the tap line is 0.68 meters. This is considerably longer than the tap lines permitted in prior art systems.

The inductance 2 and the inherent inductance of tap line 7 cause disturbances in frequency- and phase-response between 75 MHz (MegaHertz) and 110 MHz. In this area, however, the harmonics of the signals carried are so reduced that this inductance does not give rise to disturbances in data transfer. In appropriate instances, the capacitance can be increased by introducing a capacitor between central tap 3 and ground potential.

Figure 2:
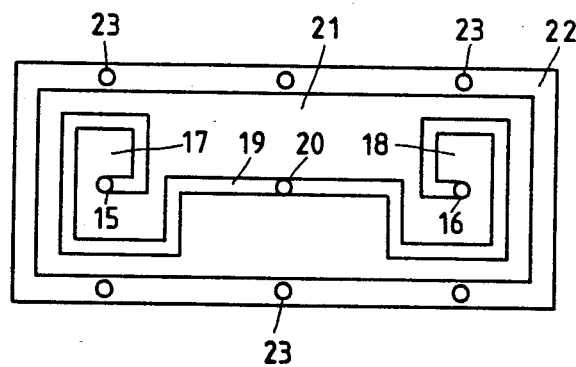
FIG. 2 is a schematic diagram of a suitable pass-through filter in the form of a printed circuit.

FIG. 2 illustrates one possible embodiment of a printed circuit pass-through filter, having a respective terminal 15, 16 for the coaxial connections of the coaxial cable of FIG. 1. From each terminal, there extends a printed conductor which forms a respective winding 17, 18. These windings are connected together by a conductor 19, in whose center is disposed a terminal 20 for tap line 7 or a coaxial connector for the tap line. The pass-through filter can be disposed on its own PC board 21. Alternatively, it can be disposed on a larger PC board bearing other circuits. A further conductive track 22 forms a ground line, in which holes 23 are provided for the cladding or shielding of the cable and plugs.

Various changes and modifications are possible within the scope of the inventive concept.

I claim:

1. Device for connection of a transmitter/receiver (9) to a coaxial cable (1) serving as a serial bus in a local area network, comprising:
   an inductance (2), in the form of a printed-circuit pass-through filter inductance having two single-loop windings (17, 18), interposed in the center conductor of said coaxial cable (1), said inductance having a central tap (3); and
   a further coaxial cable (7) interconnecting said central tap (3) and said transmitter/receiver (9), and wherein said further coaxial cable (7) has, at most, a length which gives rise to a capacitance 8 pF greater than the capacitance which, together with said inductance (2), defines the characteristic impedance of said coaxial cable forming said serial bus.

2. Device according to claim 1, wherein said inductance (2) has a value of about 75 nanoHenrys.

3. Device according to claim 2, wherein said further coaxial cable (7) has a characteristic impedance of about 75 ohms, a capacitance of about 56 picoFarads per meter, and a maximum length of about 0.7 meter.

4. Device according to claim 3, wherein said pass-through filter inductance includes two single-loop windings (17, 18).

5. Device for connection of a transmitter/receiver (9) to a first coaxial cable (1) serving as a serial bus in a local area data communication network, comprising:
   an inductance (2) interposed in series in the inner conductor of said first coaxial cable (1), having an inductive winding connected at its ends to respective ends of said first coaxial cable inner conductor resulting from an interruption of said inner conductor provided so as to permit interposition of said inductance, and also having a center tap (3); and
   a second coaxial cable (7) having a first end thereof at which its inner conductor is connected conductively and directly to said center tap of said inductance, its outer conductor being connected conductively to the outer conductor of said first coaxial cable, and having a second end connected to said transmitter/receiver (9).

6. Device according to claim 5, wherein coaxial connector means (4, 5) are provided on said device (12) for facilitating detachment of the device from said first coaxial cable, said first coaxial cable being equipped with mating connectors, so that said first coaxial cable is usable as a said serial bus either with or without the interposition of said device, said inductance and connections thereof to said coaxial connector means, as well as an end portion of said second coaxial cable, being within said device (12).

7. Device according to claim 6, wherein the outer conductor of said second coaxial cable passes through said device (12) and continues to surround the inner conductor thereof except for a region near said center tap.

8. Device according to claim 7, wherein said inductance (2) is a printed-circuit pass-through filter inductance.

9. Device according to claim 6, wherein said inductance (2) is a printed-circuit pass-through filter inductance.

10. Device according to claim 9, wherein said pass-through filter inductance includes two single-loop windings (17, 18).

11. Device according to claim 5, wherein the outer conductor of said second coaxial cable passes through said device (12) and continues to surround the inner conductor thereof except for a region near said center tap.

12. Device according to claim 5, wherein said inductance (2) is a printed-circuit pass-through filter inductance.

13. Device according to claim 12, wherein said pass-through filter inductance includes two single-loop windings (17, 18).

* * * * *